(12) United States Patent
Morita et al.

(10) Patent No.: US 6,967,482 B2
(45) Date of Patent: Nov. 22, 2005

(54) PROBE FOR NMR APPARATUS USING MAGNESIUM DIBORIDE

(75) Inventors: Hiroshi Morita, Hitachi (JP); Michiya Okada, Mito (JP); Katsuzou Aihara, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/383,655

(22) Filed: Mar. 10, 2003

(65) Prior Publication Data

US 2003/0210053 A1 Nov. 13, 2003

Related U.S. Application Data

(63) Continuation of application No. 10/315,115, filed on Dec. 10, 2002, now Pat. No. 6,768,306.

(30) Foreign Application Priority Data

May 7, 2002 (JP) ........................................ 2002-131071

(51) Int. Cl.[7] ................................................ G01V 3/00
(52) U.S. Cl. ...................................... 324/322; 324/318
(58) Field of Search ................................ 324/322, 318, 324/312, 314, 300; 505/201, 202, 844

(56) References Cited

U.S. PATENT DOCUMENTS 6,335,622 B1 * 1/2002 James et al. ................. 324/318
6,514,557 B2 * 2/2003 Finnemore et al. ........... 427/62

* cited by examiner

*Primary Examiner*—Louis Arana
(74) *Attorney, Agent, or Firm*—Dickstein Shapiro Morin & Oshinsky LLP

(57) ABSTRACT

To provide a probe coil for an NMR apparatus which can transmit and receive high frequency radio waves with improved Q-factor and S/N ratio. As a measure, the probe coil for an NMR apparatus is provided as of a solenoid type formed of magnesium diboride superconductor. As another measure, the probe coil for an NMR apparatus has a plurality of coils using magnesium diboride superconductors connected in series. As further another measure, there is used a magnesium diboride superconductor mixed with metal. As still further another measure, the probe coil for an NMR apparatus is formed by using a single metal selected from gold, silver, copper, aluminum, iron, platinum, palladium, nickel, stainless steel, chromium, magnesium, tantalum, niobium, titanium, zinc, beryllium, tungsten, or cobalt, or an alloy including a plurality thereof.

8 Claims, 6 Drawing Sheets

PROBE FOR NMR APPARATUS USING MAGNESIUM DIBORIDE

This application is a continuation of U.S. patent application Ser. No. 10/315,115, filed Dec. 10, 2002, now U.S. Pat. No. 6,768,306, the entire disclosure of which is hereby incorporated by reference.

BACKGROUND OF THE INVENTION

1. Field of the Invention

The present invention relates to a probe coil for a nuclear magnetic resonance apparatus.

2. Description of the Related Art

In general, in an NMR apparatus, there exist a CW type in which a sample is irradiated by an electromagnetic wave of radio frequency signal with a fixed frequency, and a pulse Fourier type in which a sample is irradiated by a pulse-like electromagnetic wave. Recently, however, the latter pulse Fourier type NMR has been often referred to as an NMR apparatus. In the specification in the application, the pulse Fourier type NMR apparatus is to be normally referred to as a nuclear magnetic resonance apparatus.

A fundamental arrangement about an NMR apparatus is described in "Part III, Measuring Technology" in "NMR no sho (The book of NMR)", by Yoji Arada, Maruzen, 2000. According to the reference, the NMR apparatus is arranged with a superconducting magnet that generates a static magnetic field, a probe that is provided with a probe coil therein for irradiating a sample contained inside with a high frequency pulsed magnetic field and for receiving a free induction decay signal (FID signal) transmitted from the sample, a high frequency power source that supplies a high frequency current to the probe, an amplifier that amplifies the free induction decay signal, a detector that detects the signal, and an analyzing unit that analyzes the signal detected by the detector. About the probe coil, there is a probe provided with a plurality of coils for being applicable to various nuclides and measuring methods. Moreover, the probe coil normally has a function of irradiating a sample with a high frequency pulsed magnetic field together with a function of receiving a free induction decay signal transmitted from the sample.

In a current common NMR, a probe is formed in a saddle type. According to the above-described "The book of NMR", in the case of the saddle coil, the high frequency pulsed magnetic field, i.e., an RF magnetic field, is directed perpendicularly to the direction of the axis of the coil. Hence, when a static magnetic field is provided to direct perpendicularly, the saddle coil wound around a perpendicularly set sample tube permits measurement with an RF magnetic field applied in the direction perpendicular to that of the static magnetic field.

Meanwhile, there also exists a solenoid type as a form of the probe. In the case of the solenoid coil, an RF magnetic field is directed in parallel with the direction of the axis of the coil. This, for an arrangement in which the solenoid coil is wound around a sample tube, necessitates the static magnetic field to be applied perpendicularly to the direction of the axis of the coil, i.e., in the horizontal direction. According to the above-described "The book of NMR", in the case of the solenoid coil, because of its easiness in impedance control, a value of a Q-factor, which determines a sharpness in tuning the coil, is enhanced more easily compared with the saddle coil. Furthermore, according to D. I. Hoult and R. E. Richards, "The Signal-to-Noise Ratio of the Nuclear Magnetic Resonance Experiment", J. Magn. Resonance 24, 71–85 (1976), comparison of probe coils having typical arrangements presented that the solenoid coil has calculated performance about three times higher than that of the saddle coil.

From the foregoing, it has been proved that the form of the probe coil is more preferable in the solenoid type. However, at present, an apparatus in which a vertical static magnetic field is generated by the superconducting magnet is dominant, and most of the NMR apparatus employ the saddle type probe coils. The reason for this is: (1) For employing the solenoid type probe coil, a sample tube and a center bore of the superconducting magnet for generating a static magnetic field must be disposed orthogonal to each other, which necessitates the size of the sample tube to be made small; (2) There is necessity of enlarging the diameter of the center bore of the superconducting magnet, which makes the design of the superconducting magnet difficult; or the like.

Meanwhile, as a measure for improving an S/N ratio, a low-temperature probe (cryoprobe) is sometimes used. According to the above-described "The book of NMR", the low-temperature probe is referred to as a probe with a system in which a circuit about the probe is made superconducting with the inside of the probe including a preamplifier cooled by low temperature helium gas of the order of 20K. As a superconductor therefor, an oxide superconductor is used.

The low-temperature probe has two advantages. One is a capability of enhancing a Q-factor of the coil because of lowered electric resistance of the circuit. The value of Q as the Q-factor of the coil is expressed by the following equation (1):

$$Q = \sqrt{\frac{L}{C}} \frac{1}{R} \tag{1}$$

where L is inductance, C is capacitance, and R is resistance. According to the equation (1), it is understood that the Q as the Q-factor is enhanced as the electric resistance R is decreased. The other is improvement in the S/N ratio due to lowered temperature which could reduced thermal noise of the whole circuit. A noise voltage $V_n$ can be expressed by the following equation (2):

$$V_n = \sqrt{4KT\Delta f R} \tag{2}$$

where k is Boltzmann constant, T is temperature, $\Delta f$ is bandwidth, and R is electric resistance. According to the equation (2), it is understood that the noise voltage $V_n$, becomes small as the temperature T is lowered. Moreover, in common metal, as the temperature T is lowered, the electric resistance R becomes small. Therefore, by cooling the probe to be made superconducting, the noise voltage $V_n$ can be made reduced with a rate more than a rate proportional to R to the one-half power.

Moreover, as a technology relating to the above technology, one is described in Japanese Patent Laid-Open No. 133127/1999 which, for reducing thermal noise at reception, employs a birdcage type probe coil using a superconductor cooled at a low temperature to improve S/N ratio. In this case, high-temperature superconductive material such as YBCO ($YBa_2Cu_3O_{7-x}$, yttrium series high-temperature superconductor) is used. The superconductor is applied to only a linear section of the birdcage type coil.

As explained above, by the solenoid type probe coil and the low-temperature probe, there is expected considerable improvement in performance. However, when a low-temperature probe using oxide superconductor is to be applied as a solenoid type probe coil, there arise problems as explained below. (1) An oxide superconductor commonly used in the low-temperature probe is a thin film conductor of YBCO which is difficult to be formed in shapes other than that of a linear conductor with a current technology. In addition, (2) Oxide superconductors including YBCO have a strong relationship between a direction of a magnetic field and a transport current, i.e. have so-called strong magnetic field direction dependence of the transport current, and it is known in the thin film conductor that the critical current is extremely reduced when the magnetic field acts in the direction orthogonal to the film plane. As in the above, it has been difficult up to now to make a probe coil with a complicated form to offer a problem that application to the solenoid type probe coil is difficult. Furthermore, even when using other kinds of superconductors, in a conventional superconductor wire such as a powder-in-tube superconductor wire or a superconductor wire with external stabilizing material formed by conventional extrusion, or a superconductor wire in which a superconductor is formed on a metal substrate of a good electric conductor, the metal provided around the superconductor resulted in functioning as an electromagnetic shield. This has caused a problem of making it impossible to transmit and receive high frequency radio waves.

SUMMARY OF THE INVENTION

Accordingly, it is an object of the invention to provide a probe coil for an NMR apparatus which can transmit and receive high frequency radio waves with improved Q-factor and S/N ratio.

As was reported in Nature, 410, 63–64 (2001), it has been found that magnesium diboride ($MgB_2$) exhibits superconductivity. Characteristics of $MgB_2$ are shown as follows. The critical temperature of $MgB_2$ is 39K. This is the maximum value of those of conventional metallic superconductive materials. The critical magnetic field at 0K is about 18T. This belongs to the group of high values compared with values of conventional metallic superconductive materials. The inventors, giving attention to good properties of $MgB_2$ as a superconductor, have continued studying as to whether it is possible or not to apply $MgB_2$ to the low-temperature probe coil in a solenoid shape NMR. As a result of studying, it has been ascertained that $MgB_2$ crystal powders are compressed to be capable of passing through a superconductive current and to be capable of being made into shapes other than the linear shape, and that no magnetic field direction dependence of the transport current is observed in thus made superconductors. In addition, it has been made certain that realization of the solenoid-shaped probe coil is possible without enclosing the superconductor by metal.

In order to achieve the above-described object on the basis of the above findings, the inventors have employed measures as follows.

First, as a first measure of achieving the above object, a superconductor using a magnesium diboride superconductor is used for a probe coil for an NMR apparatus. This enables realization of a probe coil for an NMR apparatus with improved Q-factor and S/N ratio.

Moreover, as a second measure, it is characterized that the probe coil for an NMR apparatus in the first measure is of a saddle type.

In addition, as a third measure, it is characterized that the probe coil for an NMR apparatus in the first measure is of a solenoid type with the center axis thereof being orthogonal to the above-described uniform static magnetic field.

In addition, as a fourth measure, the probe coil for an NMR apparatus in any one of the first to third measures is characterized in that the magnesium diboride superconductor is exposed on an outer surface of the above-described probe coil for an NMR apparatus.

In addition, as a fifth measure, the probe coil for an NMR apparatus in any one of the first to third measures is characterized by having a ceramic insulation layer in which the magnesium diboride includes silicon oxide or aluminum oxide. This enables realization of a probe coil for an NMR apparatus with a high insulating performance.

In addition, as a sixth measure, it is characterized that, in the fourth or the fifth measure, a cross section of the probe coil for an NMR apparatus is a rectangular or a circular cross section.

In addition, as a seventh measure, a probe coil for an NMR apparatus is characterized in that a plurality of coils using magnesium diboride superconductors are connected in series.

In addition, as an eighth measure, it is characterized that, in the seventh measure, the coil using magnesium diboride superconductor is of a solenoid type with the center axis thereof being orthogonal to the above-described uniform static magnetic field.

In addition, as a ninth measure, it is characterized that, in the seventh or the eighth measure, a plurality of the coils are connected by using a material including magnesium diboride.

In addition, as a tenth measure, it is characterized that a magnesium diboride superconductor mixed with metal is used for the probe coil for an NMR apparatus. This enables realization of a probe coil for an NMR apparatus that can accelerate decay of high frequency pulses by an adequate electric resistance of the coil.

In addition, as a eleventh measure, it is characterized that the probe coil for an NMR apparatus is formed by using a single metal selected from gold, silver, copper, aluminum, iron, platinum, palladium, nickel, stainless steel, chromium, magnesium, tantalum, niobium, titanium, zinc, beryllium, tungsten, or cobalt, or an alloy including a plurality thereof.

Furthermore, as a twelfth measure, it is characterized that the probe coils for the NMR apparatus in the first to eleventh measures are used for the NMR apparatus.

DESCRIPTION OF THE PREFERRED EMBODIMENTS

EXAMPLE 1

Figure 1:
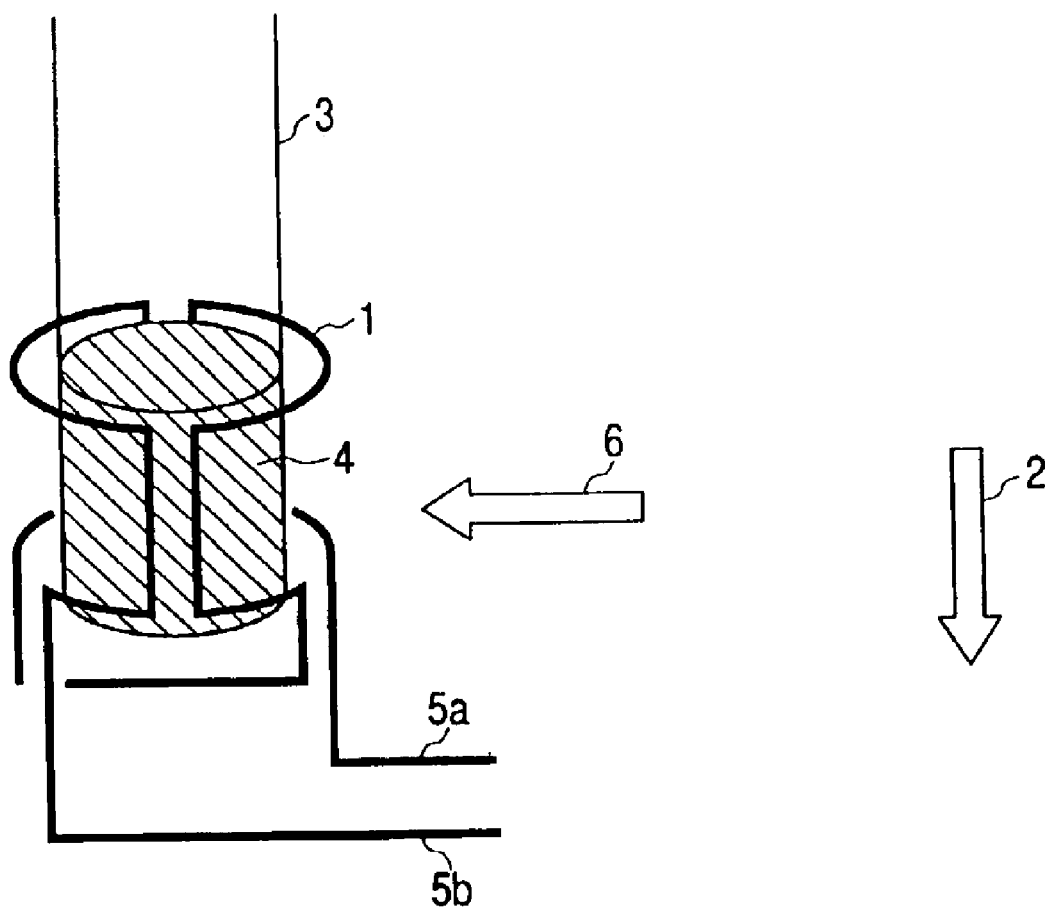
FIG. 1 is a view showing a saddle type probe coil for an NMR apparatus.

A saddle type probe coil for an NMR apparatus according to Example 1 is shown in FIG. 1. FIG. 1 illustrates main points of the invention.

A coil 1 is disposed outside a glass sample tube 3 with a shape in which coils, each known as a so-called saddle coil, are arranged opposite to each other. In the glass sample tube 3, there is contained a sample to be measured 4. The material of the coil 1 is a superconducting wire of magnesium diboride. In FIG. 1, the coil 1 is formed with two one-turn saddle coils. With the two saddle coils having the same shapes and the same number of turns, it is possible to employ arbitrary shape and number of turns. To both ends of the coil 1, a current lead 5a and a current lead 5b, being copper wires, are connected by soldering, respectively. When a direct current is supplied between the current lead 5a and the current lead 5b, each of the saddle coils generates a magnetic field in the direction 6 of an arrow in FIG. 1. Therefore, at the center of the sample 4, a uniform magnetic field can be generated in the direction 6 of the arrow. These structural elements are put in the high uniform static magnetic field generated by a superconducting magnet. The direction of the high static magnetic field in this case becomes that indicated in the direction 2.

The coil 1 may be wound around a coil bobbin. The coil bobbin, however, is required to have relative permeability close to 1, that is, to be a material with permeability thereof close to that of vacuum so as not to cause disturbance of the high uniform static magnetic field. Moreover, since the coil 1 is supplied with a high frequency pulsed current to apply a high frequency pulsed magnetic field to the sample to be measured 4, the coil bobbin is further required to be an insulator that does not shield the high frequency magnetic field. Furthermore, when the coil bobbin is provided as that including a nuclide to be measured, the coil bobbin itself generates an NMR signal to make it impossible to distinguish the NMR signal from an NMR signal transmitted from the sample to be measured 4. Thus, care is required in selecting the material. Therefore, a special glass including components for adjusting permeability is desirable for the coil bobbin. In addition, the above-described special glass is desirable not only for the coil bobbin but also for the sample tube 3 and, although not shown in FIG. 1, constituents of a vacuum insulating layer provided outside of the sample tube 3.

Figure 2:
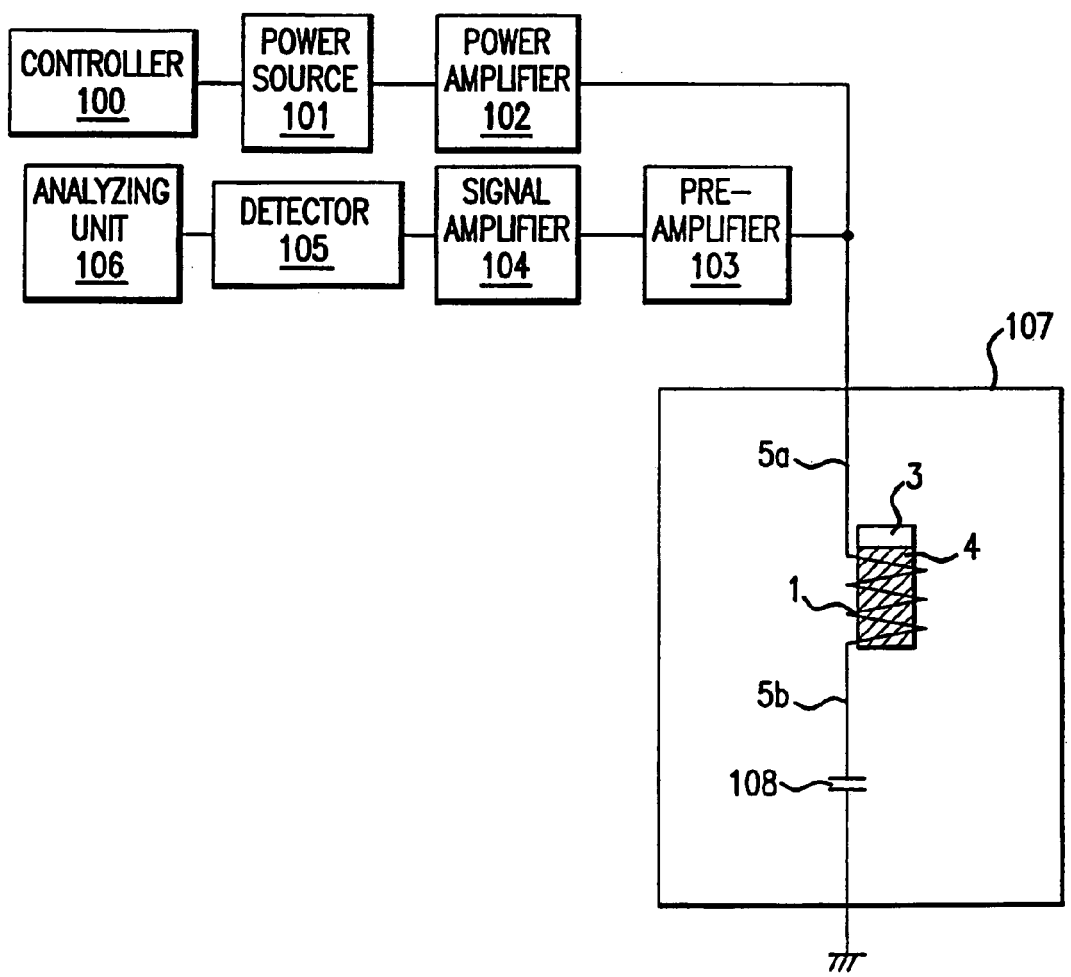
FIG. 2 is a block diagram of an NMR probe and an NMR signal measuring system.

In FIG. 2, there is shown a block diagram of an NMR probe and an NMR signal measuring system in the NMR apparatus in this Example. A probe 107 is provided with inside thereof the coil 1, a capacitor 108, and the like. The coil 1 is cooled at about 20K or below. Desirable cooling methods are a method of immersing the coil 1 in liquid helium (pool cooling method), a method of externally supplying gaseous helium (gas cooling method), a method of circulating gaseous, liquid, or supercritical helium by an external compressor (forced cooling method), a method of cooling by heat conduction by using a compact GM refrigerator (refrigerator cooling method), and the like.

In addition, although not shown specifically in FIG. 2, the probe 107 is disposed in a uniform static magnetic field generated by a superconducting magnet. To the coil 1, a high frequency pulsed current, generated at a high frequency power source 101 and amplified by a power amplifier 102, is applied through the current leads 5a and 5b. The frequency can be calculated from the static magnetic field and a gyromagnetic ratio of a nuclide to be measured. For example, when a proton is measured in a static magnetic field of 2.35T, the frequency is given as 100 MHz. The pulse width, although depending on the intensity of the magnetic field generated by the coil 1, is given as being approximately several $\mu$s to several tens of $\mu$s. The electric power required for the high frequency pulsed current is commonly several tens of watts to several hundreds of watts. The high frequency pulsed current can be generated with arbitrary frequency, pulse width, and sequence by a controller 100.

An operation of the NMR apparatus according to this Example will be explained. When the high frequency pulsed current is passed through the coil 1, a high frequency pulsed magnetic field is applied to the sample to be measured 4 in the sample tube 3. When the sample to be measured 4 includes nuclides that produce nuclear magnetic resonance, the nuclear magnetic resonance of each of the nuclides produces a free induction decay (FID) signal to be transmitted after the application of the high frequency pulsed current is ceased. The free induction decay signal is received by the coil 1. The received signal is amplified by a preamplifier 103 and a signal amplifier 104. The preamplifier 103 is cooled down to about 80K for reducing noise. The cooling method thereof is desirably the same as the cooling method of the coil 1. However, in a method of using refrigerant, the refrigerant can be nitrogen rather than helium. Moreover, when the preamplifier can be set in an environment with sufficiently small noise, no cooling is necessary for the preamplifier 103. The free induction decay signal amplified in the two stage amplifiers is detected by a detector 105 to become a signal with a bandwidth of several kHz. Further, the signal is expanded in Fourier series to be subjected to data analysis in a signal-analyzing unit 106, by which an NMR spectrum can be obtained. There are many more peripheral units than those explained above, which are, however, omitted in FIG. 2.

The inventors carried out manufacturing of the probe for an NMR apparatus as described above. The coil 1 as a saddle type has a diameter of 2 cm for a circular arc section and a length of 5 cm for a linear section with a number of turn of each of the saddle coils provided as being one turn. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. Besides, as a comparative example, a probe with the coil 1 made of copper was also manufactured for measuring the NMR spectrum of proton with the coil 1 and the preamplifier 103 kept at room temperature without being cooled. As a result of a series of tests, about the S/N ratio, it was ascertained that the probe using a magnesium diboride superconductor wire for the coil 1 was superior about five times to the probe using copper. Furthermore, it was also ascertained that the probe using magnesium diboride superconductor wire was superior about ten times in Q-factor.

As was described above, by using the superconductor made of magnesium diboride superconductor for a probe coil, realization of a probe coil for an NMR apparatus has been made possible with improved Q-factor and S/N ratio.

EXAMPLE 2

Figure 3:
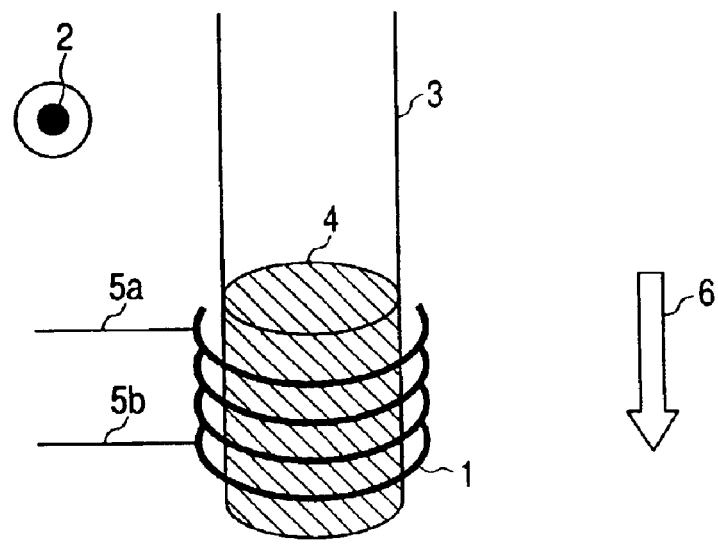
FIG. 3 is a view showing a solenoid type probe coil for an NMR apparatus.

A solenoid type probe coil for an NMR apparatus according to Example 2 is shown in FIG. 3.

Each coil 1 is disposed outside a glass sample tube 3 with a shape known as a so-called solenoid coil. In the glass sample tube 3, there is contained a sample to be measured 4. The coil 1 is formed with a superconducting wire of magnesium diboride. To both ends of the coil 1, a current lead 5a and a current lead 5b, being copper wires, are connected by soldering, respectively, by which an arrangement is provided so that, when a direct current is supplied between the current lead 5a and the current lead 5b, a uniform magnetic field can be generated in the direction 6 of an arrow at the center of the sample 4. These structural elements are put in the high uniform static magnetic field generated by a superconducting magnet. The direction of the high static magnetic field in this case is indicated in the direction 2 perpendicular to the sheet. The coil 1 may be wound around a coil bobbin. The coil bobbin, however, is required to have relative permeability close to 1, that is, to be a material with permeability thereof close to that of vacuum so as not to cause disturbance of the high uniform static magnetic field. Moreover, since the coil 1 is supplied with a high frequency pulsed current to apply a high frequency pulsed magnetic field to the sample to be measured 4, the coil bobbin is further required to be an insulator that does not shield the high frequency magnetic field. Furthermore, when the coil bobbin is provided as that including a nuclide to be measured, the coil bobbin itself generates an NMR signal to make it impossible to distinguish the NMR signal from an NMR signal transmitted from the sample to be measured 4. Thus, care is required in selecting the material. Therefore, a special glass including components for adjusting permeability is desirable for the coil bobbin. In addition, the above-described special glass is desirable not only for the coil bobbin but also for the sample tube 3 and, although not shown in FIG. 3, constituents of a vacuum insulating layer provided outside of the sample tube 3.

By using FIG. 2 again, explanations will be made about an NMR probe and an NMR signal measuring system in the NMR apparatus in this Example.

A probe 107 is provided with inside thereof the coil 1, a capacitor 108, and the like. The coil 1 is cooled at about 20K or below. Desirable cooling methods are a method of immersing the coil 1 in liquid helium (pool cooling method), a method of externally supplying gaseous helium (gas cooling method), a method of circulating gaseous, liquid, or supercritical helium by an external compressor (forced cooling method), a method of cooling by heat conduction by using a compact GM refrigerator (refrigerator cooling method), and the like. Although not shown specifically in FIG. 2, the probe 107 is disposed in a uniform static magnetic field generated by a superconducting magnet. To the coil 1, a high frequency pulsed current, generated at a high frequency power source 101 and amplified by a power amplifier 102, is applied through the current leads 5a and 5b. The frequency can be calculated from the static magnetic field and a gyromagnetic ratio of a nuclide to be measured. For example, when a proton is measured in a static magnetic field of 2.35T, the frequency is given as 100 MHz. The pulse width, although depending on the intensity of the magnetic field generated by the coil 1, is given as being approximately several $\mu$s to several tens of $\mu$s. The electric power required for the high frequency pulsed current is commonly several tens of watts to several hundreds of watts. The high frequency pulsed current can be generated with arbitrary frequency, pulse width, and sequence by a controller 100.

When the high frequency pulsed current is passed through the coil 1, a high frequency pulsed magnetic field is applied to the sample to be measured 4 in the sample tube 3. When the sample to be measured 4 includes nuclides that produce nuclear magnetic resonance, the nuclear magnetic resonance of each of the nuclides produces a free induction decay (FID) signal to be transmitted after the application of the high frequency pulsed current is ceased. The free induction decay signal is received by the coil 1. The received signal is amplified by a preamplifier 103 and a signal amplifier 104. The preamplifier 103 is cooled down to about 80K for reducing noise. The cooling method thereof is desirably the same as the cooling method of the coil 1. However, in a method of using refrigerant, the refrigerant can be nitrogen rather than helium. Moreover, when the preamplifier can be set in an environment with sufficiently small noise, no cooling is necessary for the preamplifier 103. The free induction decay signal amplified in the two stage amplifiers is detected by a detector 105 to become a signal with a bandwidth of several kHz. Further, the signal is expanded in Fourier series to be subjected to data analysis in a signal-analyzing unit 106, by which an NMR spectrum can be obtained. There are many more peripheral units than those explained above, which are, however, omitted in FIG. 2.

The inventors carried out manufacturing of the probe for an NMR apparatus as described above. The coil 1 as a solenoid type has a diameter of 2 cm and a longitudinal length of 5 cm with a number of turns of the coil 1 provided as being 10 turns. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. Besides, as a comparative example, a probe with the coil 1 made of copper was also manufactured for measuring the NMR spectrum of proton with the coil 1 and the preamplifier 103 kept at room temperature without being cooled. As a result of a series of tests, about the S/N ratio, it was ascertained that the probe using a magnesium diboride superconductor wire for the coil 1 was superior about five times to the probe using copper. Furthermore, it was also ascertained that the probe using magnesium diboride superconductor wire was superior about twenty times in Q-factor.

As was described above, by using the superconductor made of magnesium diboride superconductor for a probe coil, realization of a probe coil for an NMR apparatus has been made possible with improved Q-factor and S/N ratio. Furthermore, the values were improved ones compared with those in Example 1 to have enabled realization of a probe coil for the NMR apparatus with further higher performances by providing the form of the coil as being the solenoid type.

EXAMPLE 3

Figure 4:
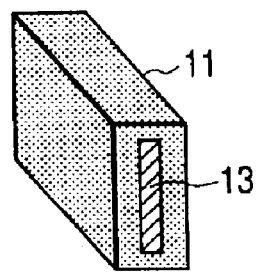
FIG. 4 is a view showing a rectangular section reinforcing member including type magnesium diboride superconducting wire.

In FIG. 4, there is shown the case of using a magnesium diboride superconducting wire for the probe coil for the NMR apparatus in Example 3. Except for the arrangement, this Example is almost the same as Example 2.

Figure 5:
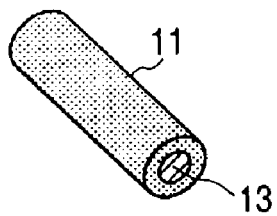
FIG. 5 is a view showing a circular section reinforcing member including type magnesium diboride superconducting wire.
Figure 6:
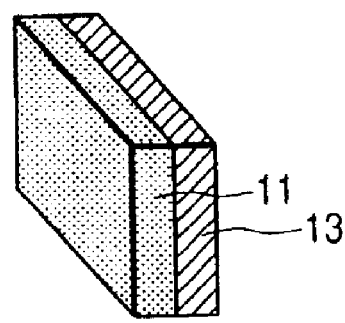
FIG. 6 is a view showing a tape type magnesium diboride superconducting wire.

The magnesium diboride superconducing wire has the magnesium diboride superconductor 11 exposed on an outer surface of the wire with a reinforcing member 13 to be a supporting member disposed inside. The magnesium diboride superconductor 11 can be used as a green compact for which material powders are compressed, a sintered compact solidified by heat treatment, a crystalline solid grown on the reinforcing member by CVD etc., and the like. For the reinforcing member 13, there can be used a metal such as copper, aluminum, nickel, or silver, an alloy such as stainless steel, copper alloy, a metallic super conductor such as niobium-titanium, a carbon fiber, a boron fiber, ceramics such as alumina or silica, or the like. Moreover, when it can be judged that the superconducting wire has enough strength to require no reinforcing member 13, no reinforcing member 13 can be necessary. Furthermore, although the magnesium diboride superconducting wire in FIG. 4 has a rectangular cross section, the cross section can be a circular one as shown in FIG. 5 or that in which a magnesium diboride thin film is formed on the surface of the reinforcing member 13 as shown in FIG. 6. Each of the magnesium diboride superconducting wires in FIG. 4, FIG. 5, and FIG. 6 has a structure of a single core wire with a single superconductor. For the wire, however, there can be used a multi-core wire with a structure in which a plurality of superconducting wires are bundled. The superconducting wire with a structure of being thus exposed on the outersurface of the probe coil for an NMR apparatus causes less attenuation of the high frequency magnetic field on the peripheral section compared with such a superconducting wire as to have a metal periphery. This enables efficient irradiation with a high frequency magnetic field and reception of an FID signal.

The inventors carried out manufacturing of the probe for an NMR apparatus as described above. The coil 1 as a solenoid type has a diameter of 2 cm and a longitudinal length of 5 cm with a number of turns of the coil 1 provided as being 10 turns. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. Besides, as a comparative example, a probe with the coil 1 made of copper was also manufactured for measuring the NMR spectrum of proton with the coil 1 and the preamplifier 103 kept at room temperature without being cooled. As a result of a series of tests, about the SIN ratio, it was ascertained that the probe using a magnesium diboride superconductor wire for the coil 1 was superior about six times to the probe using copper. Furthermore, it was also ascertained that the probe using magnesium diboride superconductor wire was superior about twenty-five times in the Q-factor.

As was described above, by using for a probe coil the superconductor wire with the magnesium diboride superconductor 11 exposed on the surface thereof, realization of a probe coil for an NMR apparatus has been made possible with improved Q-f actor and S/N ratio. Furthermore, by using the superconducting wire with magnesium diboride provided around, the values of the Q-factor and the S/N ratio were improved ones even in the comparison with those in Example 1 to have enabled realization of a probe coil for the NMR apparatus with further higher performances.

EXAMPLE 4

Figure 7:
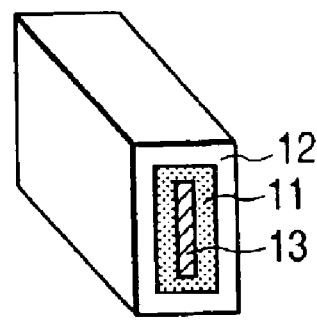
FIG. 7 is a view showing a rectangular section reinforcing member including type magnesium diboride superconducting wire with an insulation layer.

In FIG. 7, there is shown an example of using a magnesium diboride superconducing wire for the probe coil for the NMR apparatus in Example 4. Except for the arrangement, this Example is almost the same as Example 2.

Figure 8:
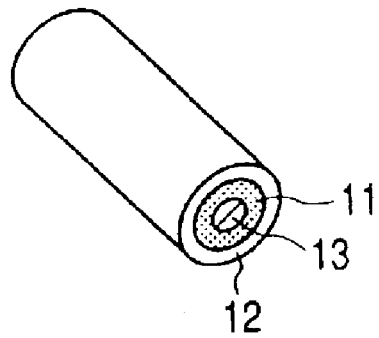
FIG. 8 is a view showing a circular section reinforcing member including type magnesium diboride superconducting wire with an insulation layer.
Figure 9:
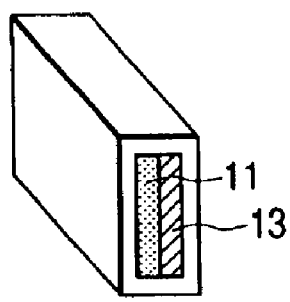
FIG. 9 is a view showing a tape type magnesium diboride superconducting wire with an insulation layer.

The magnesium diboride superconducing wire has an insulation layer 12 of silicon oxide or aluminum oxide on a surface of the wire with the magnesium diboride superconductor 11 and a reinforcing member 13 to be a supporting member disposed inside thereof. The magnesium diboride superconductor 11 can be used as a green compact for which material powders are compressed, a sintered compact solidified by heat treatment, a crystalline solid grown on the reinforcing member by CVD, etc., and the like. For the reinforcing member 13, there can be used a metal such as copper, aluminum, nickel, or silver, an alloy such as stainless steel, copper alloy, a metallic super conductor such as niobium-titanium, a carbon fiber, a boron fiber, ceramics such as alumina or silica, or the like. Moreover, when it can be judged that the superconducting wire has enough strength to require no reinforcing member 13, no reinforcing member 13 can be necessary. Furthermore, although the magnesium diboride superconducting wire in FIG. 7 has a rectangular cross section, the cross section can be a circular one as shown in FIG. 8 or that in which a magnesium diboride thin film is formed on the surface of the reinforcing member 13 as shown in FIG. 6 with an insulation layer 12 further provided thereon. Each of the magnesium diboride superconducting wires in FIG. 7, FIG. 8, and FIG. 6 has a structure of a single core wire with a single superconductor. For the wire, however, there can be used a multi-core wire with a structure in which a plurality of superconducting wires are bundled. The superconducting wire with such a structure, having an insulator formed around, causes less attenuation of the high frequency magnetic field on the peripheral section compared with such a superconducting wire as to have a metal periphery. This enables not only efficient irradiation with a high frequency magnetic field and reception of an FID signal but also improvement in withstand voltage.

The inventors carried out manufacturing of the probe for an NMR apparatus as described above. The coil 1 as a solenoid type has a diameter of 2 cm and a longitudinal length of 5 cm with a number of turns of the coil 1 provided as being 10 turns. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. As a result of a series of tests, it was ascertained that the probe was almost equivalent to the probe shown in Example 3 about the S/N ratio and the Q-factor, but the withstand voltage was improved by a hundred times.

As was described above, by using for a probe coil the insulation layer around the superconductor wire with the magnesium diboride superconductor 11 exposed on the surface thereof, realization of a probe coil for an NMR apparatus has been made possible with an improved withstand voltage.

EXAMPLE 5

Figure 10:
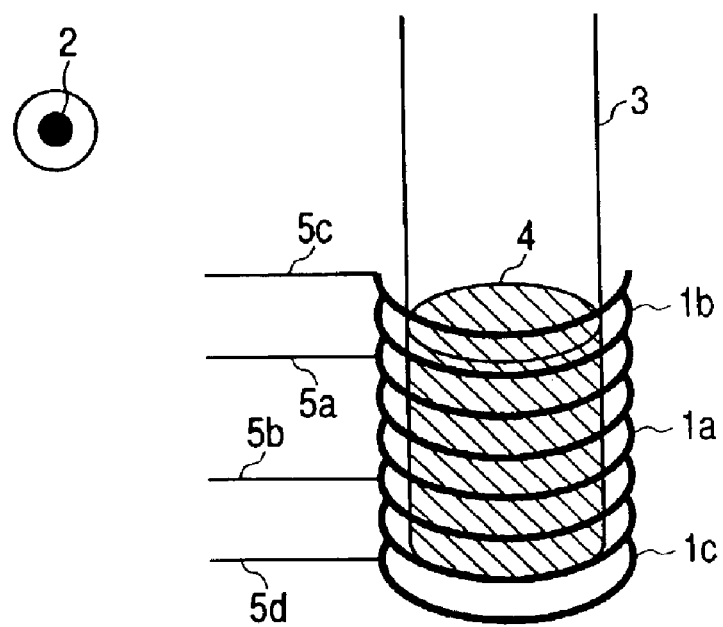
FIG. 10 is a view showing a superconductive connection type solenoid type probe coil for an NMR apparatus.

A solenoid type probe coil for an NMR apparatus according to Example 5 is shown in FIG. 10. Except for this, this Example is almost the same as Example 4.

As shown in FIG. 10, coils 1a, 1b, and 1c are connected in series electrically. At connections, two magnesium diboride superconductor wires, after insulation layers thereof being removed, are brought into superconductive connection through magnesium diboride superconductive powders to provide electric resistance of the coils connected in series as being almost zero at or below the critical temperature. The connection is desirably provided by a method of lapping two magnesium diboride superconductor wires over a distance of several centimeters with insulation layers thereof being removed (lap connection method) or a method of getting cross sections of the connections butted against each other (butt connection method). Moreover, for bringing electric resistance close to zero, the connection is desirably provided through the magnesium diboride superconductor. With structures thus prepared, even in the case in which it is difficult to integrally form the coil, by connecting divided coils later, the whole electric resistance can be brought close to zero. Therefore, according to the expression 1 and the expression 2, it becomes possible to improve Q-factor and S/N ratio.

To both ends of the coil $1a$, a current lead $5a$ and a current lead $5b$, being copper wires, are connected by soldering, respectively. Moreover, to the other end of the coil $1b$ and to the other end of the coil $1c$, a current lead $5c$ and a current lead $5d$ are connected by soldering, respectively. By thus providing a number of current leads, it becomes possible to determine an intensity of a generated magnetic field and an inductance depending on resonant frequency of a nuclide as a subject to be measured. For example, application of a high frequency pulsed current between the $5a$ and $5b$ for $^1H$, and that between $5c$ and $5d$ for $^{13}C$, enable matching the resonant frequency and the inductance to each of the nuclide as the subjects to be measured. Incidentally, in this Example, although the current leads were connected to the connections of the coils $1a$, $1b$, and $1c$, the connections are not limited to those, but may be provided at any arbitrary points of the coils.

The structural elements explained above are, in an NMR probe, put in the high uniform static magnetic field generated by a superconducting magnet. The direction of the high static magnetic field in this case is indicated in the direction 2 perpendicular to the sheet.

Figure 11:
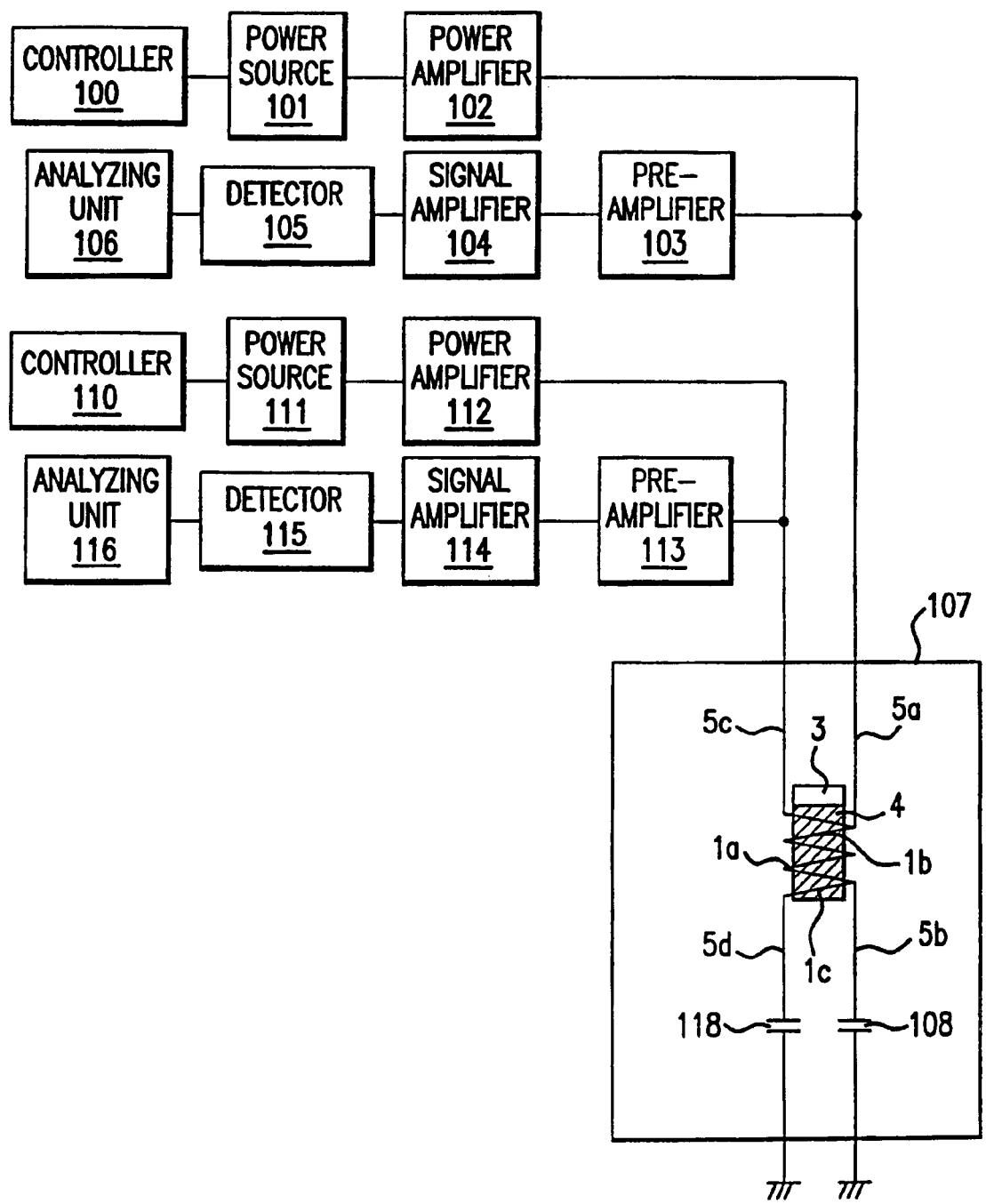
FIG. 11 is a block diagram of an NMR probe and an NMR signal measuring system applicable to multi-nuclides.

In FIG. 11, there is shown a block diagram of an NMR probe and an NMR signal measuring system in the NMR apparatus in this Example. A probe 107 is provided with inside thereof the coils $1a$, $1b$ and $1c$, capacitors 108 and 118, and the like. The coils $1a$, $1b$ and $1c$ are cooled at about 20K or below. Desirable cooling methods are a method of immersing the coils $1a$, $1b$ and $1c$ in liquid helium (pool cooling method), a method of circulating gaseous, liquid, or supercritical helium by an external compressor (forced cooling method), a method of cooling by heat conduction by using a compact GM refrigerator (refrigerator cooling method), and the like. Although not shown specifically in FIG. 11, the probe 107 is disposed in a uniform static magnetic field generated by a superconducting magnet. To the coil $1a$, a high frequency pulsed current, generated at a high frequency power source 101 and amplified by a power amplifier 102, is applied through the current leads $5a$ and $5b$. The frequency can be calculated from the static magnetic field and a gyromagnetic ratio of a nuclide to be measured. For example, when a proton is measured in a static magnetic field of 2.35T, the frequency is given as 100 MHz. The pulse width, although depending on the intensity of the magnetic field generated by the coil $1a$, is given as being approximately several As to several tens of $\mu$s. The electric power required for the high frequency pulsed current is commonly several tens of watts to several hundreds of watts. The high frequency pulsed current can be generated with arbitrary frequency, pulse width, and sequence by a controller 100. When the high frequency pulsed current is passed through the coil $1a$, a high frequency pulsed magnetic field is applied to the sample to be measured 4 in the sample tube 3. When the sample to be measured 4 includes nuclides that produce nuclear magnetic resonance, the nuclear magnetic resonance of each of the nuclides produces a free induction decay (FID) signal to be transmitted after the application of the high frequency pulsed current is ceased. The free induction decay signal is received by the coil $1a$. The received signal is amplified by a preamplifier 103 and a signal amplifier 104. The preamplifier 103 is cooled down to about 80K for reducing noise. The cooling method thereof is desirably the same as the cooling method of the coil 1. However, in a method of using refrigerant, the refrigerant can be nitrogen rather than helium. Moreover, when the preamplifier can be set in an environment with sufficiently small noise, no cooling is necessary for the preamplifier 103. The free induction decay signal amplified in the two stage amplifiers is detected by a detector 105 to become a signal with a bandwidth of several kHz. Further, the signal is expanded in Fourier series to be subjected to data analysis in a signal-analyzing unit 106, by which an NMR spectrum can be obtained. There are many more peripheral units than those explained above, which are, however, omitted in FIG. 11.

Meanwhile, to a coil in which the coil $1b$, $1a$ and $1c$ are connected in series, a high frequency pulsed current, generated at a high frequency power source 111 and amplified by a power amplifier 112, is applied through the current leads $5c$ and $5d$. The frequency can be calculated from the static magnetic field and a gyromagnetic ratio of a nuclide to be measured. For example, when $^{13}C$ is measured in a static magnetic field of 2.35T, the frequency is given as 15 MHz. The pulse width, although depending on the intensity of the magnetic field generated by the coil in which the coil $1b$, $1a$ and $1c$ are connected in series, is given as being approximately several $\mu$s to several tens of $\mu$s. The electric power required for the high frequency pulsed current is commonly several tens of watts to several hundreds of watts. The high frequency pulsed current can be generated with arbitrary frequency, pulse width, and sequence by a controller 110.

When the high frequency pulsed current is passed through the coil in which the coil $1b$, $1a$ and $1c$ are connected in series, a high frequency pulsed magnetic field is applied to the sample to be measured 4 in the sample tube 3. When the sample to be measured 4 includes nuclides that produce nuclear magnetic resonance, the nuclear magnetic resonance of each of the nuclides produces a free induction decay (FID) signal to be transmitted after the application of the high frequency pulsed current is ceased. The free induction decay signal is received by the coil in which the coil $1b$, $1a$ and $1c$ are connected in series. The received signal is amplified by a preamplifier 113 and a signal amplifier 114. The preamplifier 113 is cooled down to about 80K for reducing noise. The cooling method thereof is desirably the same as the cooling method of the coil 1. However, in a method of using refrigerant, the refrigerant can be nitrogen rather than helium. Moreover, when the preamplifier can be set in an environment with sufficiently small noise, no cooling is necessary for the preamplifier 113. The free induction decay signal amplified in the two stage amplifiers is detected by a detector 115 to become a signal with a bandwidth of several kHz. Further, the signal is expanded in Fourier series to be subjected to data analysis in a signal-analyzing unit 116, by which an NMR spectrum can be obtained.

In general, for measuring NMR spectra of nuclides different from one another, probe coils are required by the number equivalent to that of nuclides to be measured. However, as described above, by taking the coil 1a as that for detecting proton and the coil in which the coil 1b, 1a and 1c are connected in series as that for $^{13}$C, that is, by sharing the coil 1a, the volume of the whole coil can be reduced to have made it possible to downsize the NMR probe coil. There are many more peripheral units than those explained above, which are, however, omitted in FIG. 11.

The inventors carried out manufacturing of the probe for an NMR apparatus as described above. The coil 1a as a solenoid type has a diameter of 2 cm and a longitudinal length of 5 cm with a number of turns of the coil 1a provided as being 10 turns. While, each of the coils 1b and 1c has a diameter of 2 cm and a longitudinal length of 2 cm.

The coils 1a, 1b, and 1c were cooled at about 10K by a gas cooling method using gaseous helium and the preamplifiers 103 and 113 were cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz and 15 MHz as the resonant frequencies of proton.

As a result of a series of tests, it was ascertained that the probe was almost equivalent about the S/N ratio and the Q-factor to the probe shown in Example 2 to provide sufficiently high performance.

EXAMPLE 6

In Example 6, it is characterized that a probe coil for an NMR apparatus is a magnesium diboride superconductor 11 mixed with metal, which superconductor is formed on the basis of a mixture of magnesium diboride powders and metal powders. Except for this point, this Example is almost the same as Example 4. This brings realization of a probe coil that can accelerate the decay of the high frequency pulsed current by adequate electric resistance of the coil.

The probe for an NMR apparatus carries out transmission of a high frequency pulsed magnetic field to a sample and reception of a free induction decay signal by the same probe. Since the free induction decay signal must be observed immediately after the transmission of the high frequency pulsed magnetic field, in the probe coil, the high frequency pulsed current must have been immediately decayed. When the probe coil is formed with a superconductor, however, the decay time tends to become longer, for which the starting time for capturing the free induction decay signal is inevitably delayed to cause a problem of reducing amount of the free induction decay signal data. In order to solve the problem, a slight trace of metal with some degree of normal conductivity was added to the superconductor, by which a slight electric resistance was developed to make it possible to accelerate decay of the high frequency pulsed current. Addable metal is copper, aluminum, nickel, silver, lead, tin, indium, or the like, effect of which can be observed with a maximum amount of addition up to several %, although the effect depends on the kind of added metal.

The inventors carried out manufacturing of the probe for an NMR apparatus as described above. The coil 1 as a solenoid type has a diameter of 2 cm and a longitudinal length of 5 cm with a number of turns of the coil 1 provided as being 10 turns. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. As a result of a series of tests, it was ascertained that the probe was almost equivalent to the probe shown in Example 3 about the S/N ratio and the Q-factor, but the decay time of the high frequency pulsed current was improved down to one twentieth compared with that in Example 3.

As was described above, by adding a slight trace of metal with some degree of normal conductivity to a superconductor, a slight electric resistance was made developed in the coil. This enabled realization of a probe coil for an NMR apparatus that can accelerate the decay of the high frequency pulse.

EXAMPLE 7

In Example 7, it is characterized that a probe coil for an NMR apparatus is formed with a single metal selected from gold, silver, copper, aluminum, iron, platinum, palladium, nickel, stainless steel, chromium, magnesium, tantalum, niobium, titanium, zinc, beryllium, tungsten, or cobalt, or an alloy including a plurality thereof. Except for this point, this Example is almost the same as Example 4.

The inventors carried out manufacturing of the probe for an NMR apparatus as described above. The coil 1 as a solenoid type has a diameter of 2 cm and a longitudinal length of 5 cm with a number of turns of the coil 1 provided as being 10 turns. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. Besides, as a comparative example, a probe with the coil 1 made of copper was also manufactured for measuring the NMR spectrum of proton with the coil 1 and the preamplifier 103 kept at room temperature without being cooled. As a result of a series of tests, about the S/N ratio, it was ascertained that the probe using the cooled metal for the coil 1 was superior about three times to the probe using copper. Furthermore, it was also ascertained that the probe was superior about ten times in the Q-factor.

As was described above, by using for a probe coil the cooled metal, realization of a probe coil for an NMR apparatus has been made possible with improved Q-factor and S/N ratio.

EXAMPLE 8

In Example 8, it is characterized that a probe coil for an NMR apparatus is formed with a superconductor of $YBa_2Cu_3O_{7-x}$, $Bi_2Sr_2Ca_1Cu_2O_x$, or $Bi_2Sr_2Ca_2Cu_3O_x$. Except for this, this Example is almost the same as Example 4.

The inventors carried out manufacturing of the probe for an NMR apparatus as described above. The coil 1 as a solenoid type has a diameter of 2 cm and a longitudinal length of 5 cm with a number of turns of the coil 1 provided as being 10 turns. The coil 1 was cooled at about 10K by a gas cooling method using gaseous helium and the preamplifier 103 was cooled at about 77K by a pool cooling method using liquid nitrogen. The probe for an NMR apparatus as described above was disposed in a high uniform static magnetic field of 2.35T to measure an NMR spectrum of proton in ethanol by using a high frequency power source of 100 MHz as the resonant frequency of proton. Besides, as a comparative example, a probe with the coil 1 made of copper was also manufactured for measuring the NMR spectrum of proton with the coil 1 and the preamplifier 103 kept at room temperature without being cooled. As a result of a series of tests, about the S/N ratio, it was ascertained that the probe using the superconductor of $YBa_2Cu_3O_{7-x}$, $Bi_2Sr_2Ca_1Cu_2O_x$, or $Bi_2Sr_2Ca_2Cu_3O_x$ for the coil 1 was superior about three to ten times to the probe using copper. Furthermore, it was also ascertained that the probe was superior about five to twenty times in the Q-factor.

As was described above, by using for a probe coil the superconductor of $YBa_2Cu_3O_{7-x}$, $Bi_2Sr_2Ca_1Cu_2O_x$, or $Bi_2Sr_2Ca_2Cu_3O_x$, realization of a probe coil for an NMR apparatus has been made possible with improved Q-factor and S/N ratio.

As described above, a probe coil for an NMR apparatus can be provided which can transmit and receive high frequency radio waves with improved Q-factor and S/N ratio.

What is claimed is:

1. A probe coil for an NMR apparatus comprising a plurality of coils using magnesium diboride superconductors, wherein the coil using said magnesium diboride superconductor is of a solenoid type.

2. The probe coil for an NMR apparatus according to claim 1, wherein a plurality of said coils are connected by using a material including magnesium diboride.

3. A probe coil for an NMR apparatus according to claim 1, wherein the coil uses a magnesium diboride superconductor mixed with metal.

4. A probe coil for an NMR apparatus according to claim 1, wherein the coil comprises one of gold, silver, copper, aluminum, iron, platinum, palladium, nickel, stainless steel, chromium, magnesium, tantalum, niobium, titanium, zinc, beryllium, tungsten, and cobalt, or an alloy including a plurality thereof.

5. The probe coil for an NMR apparatus according to claim 1, wherein said magnesium diboride superconductor is exposed on an outer surface of said coil for an NMR appartus.

6. The probe coil for an NMR apparatus according to claim 1, wherein said probe coil for an NMR apparatus has a ceramic insulation layer made of silicon oxide or aluminum oxide that covers the magnesium diboride superconductor wire.

7. The probe coil for an apparatus according to claim 5, wherein a cross sectional of said probe coil for an NMR apparatus is a rectangular or a circular cross section.

8. An NMR apparatus using the probe coil for an NMR apparatus according to one of claims 1–4 or 5–7.

* * * * *